United States Patent
Uchida et al.

(10) Patent No.: US 11,300,622 B2
(45) Date of Patent: Apr. 12, 2022

(54) BATTERY VALUE SETTING APPARATUS

(71) Applicant: Honda Motor Co., Ltd., Tokyo (JP)

(72) Inventors: Tsubasa Uchida, Wako (JP); Yukiko Onoue, Wako (JP); Yu Murai, Wako (JP)

(73) Assignee: Honda Motor Co., Ltd., Tokyo (JP)

( * ) Notice: Subject to any disclaimer, the term of this patent is extended or adjusted under 35 U.S.C. 154(b) by 59 days.

(21) Appl. No.: 17/028,995

(22) Filed: Sep. 22, 2020

(65) Prior Publication Data

US 2021/0088592 A1  Mar. 25, 2021

(30) Foreign Application Priority Data

Sep. 24, 2019  (JP) .............................. JP2019-172495

(51) Int. Cl.
*G01R 31/367* (2019.01)
*H01M 10/42* (2006.01)
*G01R 31/392* (2019.01)

(52) U.S. Cl.
CPC ......... *G01R 31/367* (2019.01); *G01R 31/392* (2019.01); *H01M 10/425* (2013.01); *H01M 2010/4271* (2013.01); *H01M 2010/4278* (2013.01)

(58) Field of Classification Search
None
See application file for complete search history.

(56) References Cited

U.S. PATENT DOCUMENTS 10,717,362 B2 *  7/2020  Liang ...................... B60L 58/21
2014/0201090 A1 *  7/2014  Liang ................... B60L 53/305
                                                              705/307

FOREIGN PATENT DOCUMENTS

JP           2014063617 A        4/2014

* cited by examiner

*Primary Examiner* — Roy Y Yi
(74) *Attorney, Agent, or Firm* — Duft & Bornsen, PC

(57) ABSTRACT

A battery value setting apparatus including an electronic control unit including a microprocessor and a memory connected to the microprocessor. The microprocessor is configured to perform, acquiring a battery information including an information on a usage record of a battery mounted on a predetermined object, determining whether there is an abnormal usage record of the battery based on the battery information, and setting a trade-in value of the battery when it is determined that there is the abnormal usage record lower than the trade-in value when it is determined that there is not the abnormal usage record.

8 Claims, 4 Drawing Sheets

BATTERY VALUE SETTING APPARATUS

CROSS-REFERENCE TO RELATED APPLICATION

This application is based upon and claims the benefit of priority from Japanese Patent Application No. 2019-172495 filed on Sep. 24, 2019, the content of which is incorporated herein by reference.

BACKGROUND OF THE INVENTION

Field of the Invention

This invention relates to a battery value setting apparatus configured to set a trade-in value of a battery mounted on a vehicle or the like.

Description of the Related Art

Conventionally, as a device of this type, there has been a known apparatus configured to evaluate a future residual value of a battery. Such an apparatus is described, for example, in Japanese Unexamined Patent Publication No. 2014-063617 (JP2014-063617A). In the apparatus described in JP2014-063617A, the residual value of the battery after a predetermined period is determined based on a current state quantity of the battery such as a number of charge and discharge times of the battery, a resistance measurement value and a capacity measurement value, and a test data stored in advance, and the battery is rated from this residual value.

The quality of the battery is affected not only by the state quantity of the battery, but also by presence or absence of abnormal use of the battery, such as a load acting on the battery has exceeded a normal range. However, since the apparatus described in JP2014-063617A determines the residual value without sufficiently considering this point, it is difficult to set an appropriate trade-in value of the battery.

SUMMARY OF THE INVENTION

An aspect of the present invention is a battery value setting apparatus, including an electronic control unit including a microprocessor and a memory connected to the microprocessor. The microprocessor is configured to perform acquiring a battery information including an information on a usage record of a battery mounted on a predetermined object, determining whether there is an abnormal usage record of the battery based on the battery information, and setting a trade-in value of the battery when it is determined that there is the abnormal usage record lower than the trade-in value when it is determined that there is not the abnormal usage record.

BRIEF DESCRIPTION OF THE DRAWINGS

The objects, features, and advantages of the present invention will become clearer from the following description of embodiments in relation to the attached drawings, in which.

DETAILED DESCRIPTION OF THE INVENTION

Hereinafter, an embodiment of the present invention is explained with reference to FIGS. 1 to 4. A battery value setting apparatus according to the embodiment of the present invention is configured to set a trade-in value to a battery mounted on a vehicle. More specifically, the battery mounted on the vehicle may be served as a secondary use, i.e., reused or as a recycle, after a primary use. In the present embodiment, the battery value setting apparatus is configured so as to set the trade-in value in such a case. Hereafter, an example of a battery value setting apparatus will be described using a battery used primarily in a vehicle as a predetermined object, i.e., in a vehicle including a travel motor, such as an electric vehicle or hybrid vehicle.

Figure 1:
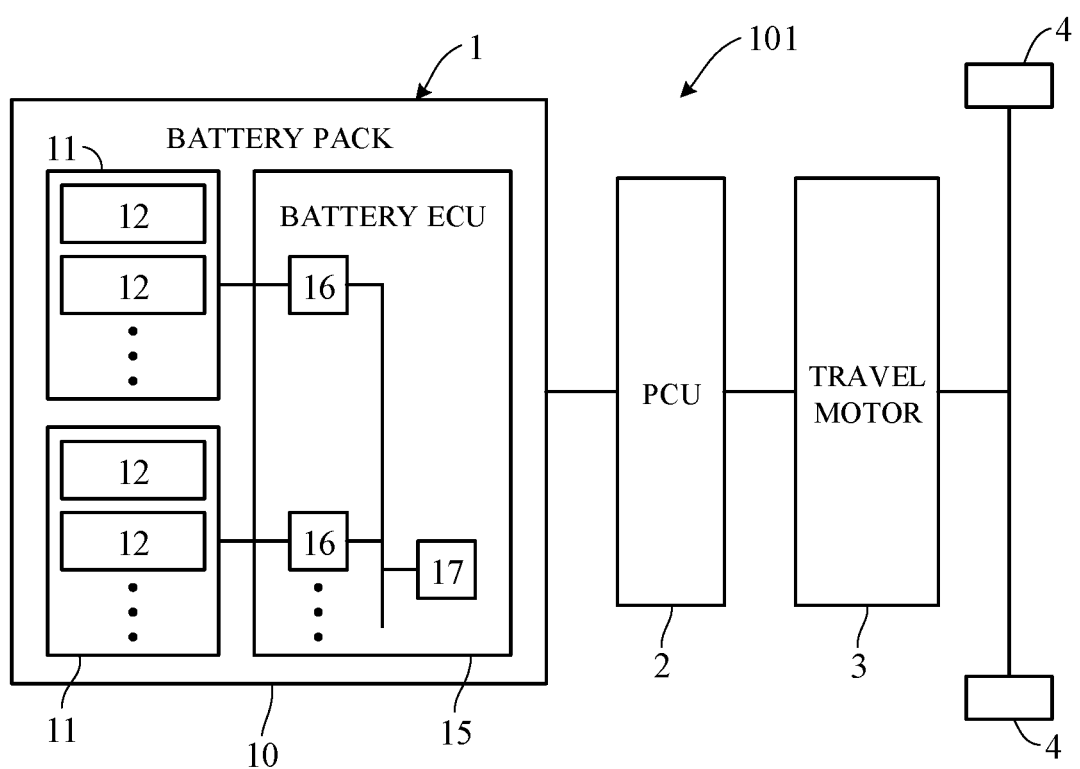
FIG. 1 is a diagram schematically showing a configuration of main components of a travel drive system of a motor-driven vehicle as an object to which a battery value setting apparatus according to an embodiment of the invention is applied.

FIG. 1 is a diagram schematically showing a configuration of main components of a travel drive system of a motor-driven vehicle 101 (may be simply referred to as a vehicle) to which the battery value setting apparatus according to the present embodiment is applied. As shown in FIG. 1, the vehicle 101 includes a battery 1, a power control unit (PCU) 2, and a travel motor 3.

The battery 1 is configured as a unit by a single battery pack 10. The battery 1 may be configured by multiple battery packs 10. If the battery 1 is configured by the single battery pack 10 as seen in the present embodiment, the battery 1 and battery pack 10 are the same. For this reason, hereafter, the battery pack 10 may be referred to as the battery 1, or the battery 1 may be referred to as the battery pack 10. The battery 1 has an identification ID (battery ID) assigned for identifying the battery 1.

The battery pack 10 includes multiple battery modules 11 and a battery ECU (Electronic Control Unit) 15. The battery modules 11 are connected with each other in series or in parallel through a bus bar or the like. These battery modules 11 each include multiple cells 12. The cell 12 is, for example, a flat lithium-ion cell sealed by a laminate film and includes electrode plates. The cells 12 are housed in the sealed housing of the battery module 11 so as to connect the electrode plates in series or in parallel, forming a lithium-ion battery.

The battery ECU 15 includes a CPU (microprocessor), memory such as ROM or RAM, and other peripheral circuits, and a function for monitoring a state of the battery 1. More specifically, the battery ECU 15 includes multiple detection circuits 16 that detect respective states of the battery modules 11 and a detection circuit 17 that detects a state of the battery pack 10. For example, the detection circuits 16 each include sensors that detect the physical quantities, such as the current, voltage, and temperature, of the corresponding battery module 11. The detection circuits 16 calculate a state of charge SOC and a state of health SOH of the respective battery modules 11 on the basis of the detected physical quantities. The detection circuit 17 calculates the SOC and SOH of the entire battery on the basis of signals from the detection circuits 16.

The battery ECU 15 also functions as a control apparatus for controlling charging and discharging of the battery 1 according to a program stored in advance in the memory. In the program, respective limit values of physical quantities such as a current flowing through the battery 1, a voltage of the battery 1 and a temperature of the battery 1, and limit value of the SOC, etc., are set. The battery ECU 15 controls charging and discharging of the battery 1 so as not to exceed these limit values based on the detected values of the detection circuits 16 and 17 and the like. It is also possible to control the charging and discharging of the battery 1 by the power control unit 2 rather than the battery ECU 15.

The battery 1 supplies power to the power control unit (PCU) 2 through a junction box (not shown). The power control unit 2 includes an inverter circuit. The power control unit 2 converts a direct current from the battery 1 into an alternating current using the inverter circuit and supplies a drive power to the travel motor 3. Thus, the travel motor 3 is driven, drive wheels 4 are rotationally driven, and the vehicle 101 travels.

Figure 2:
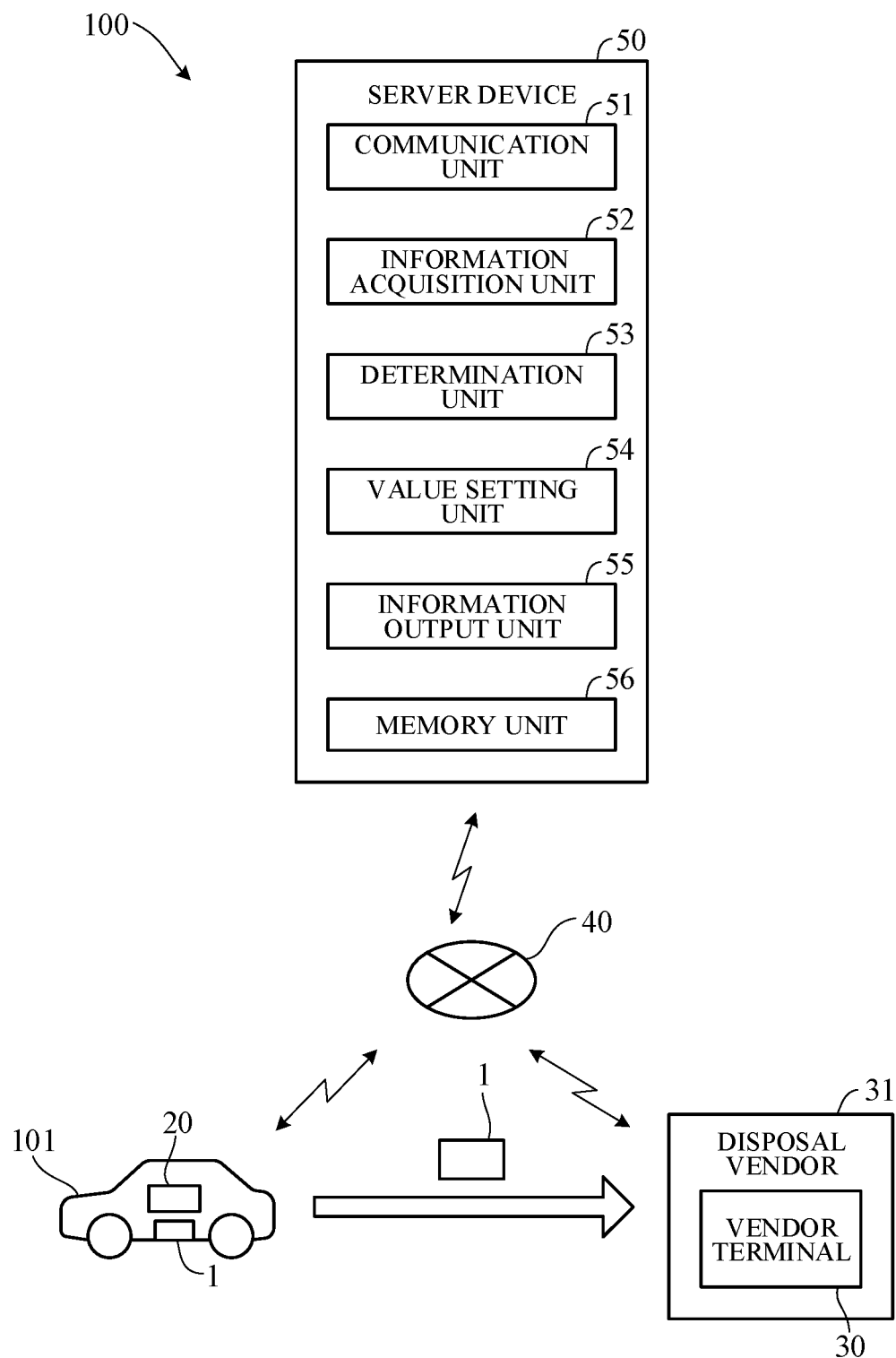
FIG. 2 is a block diagram schematically showing an overall configuration of a battery value setting system including the battery value setting apparatus according to the embodiment of the present invention.
Figure 3:
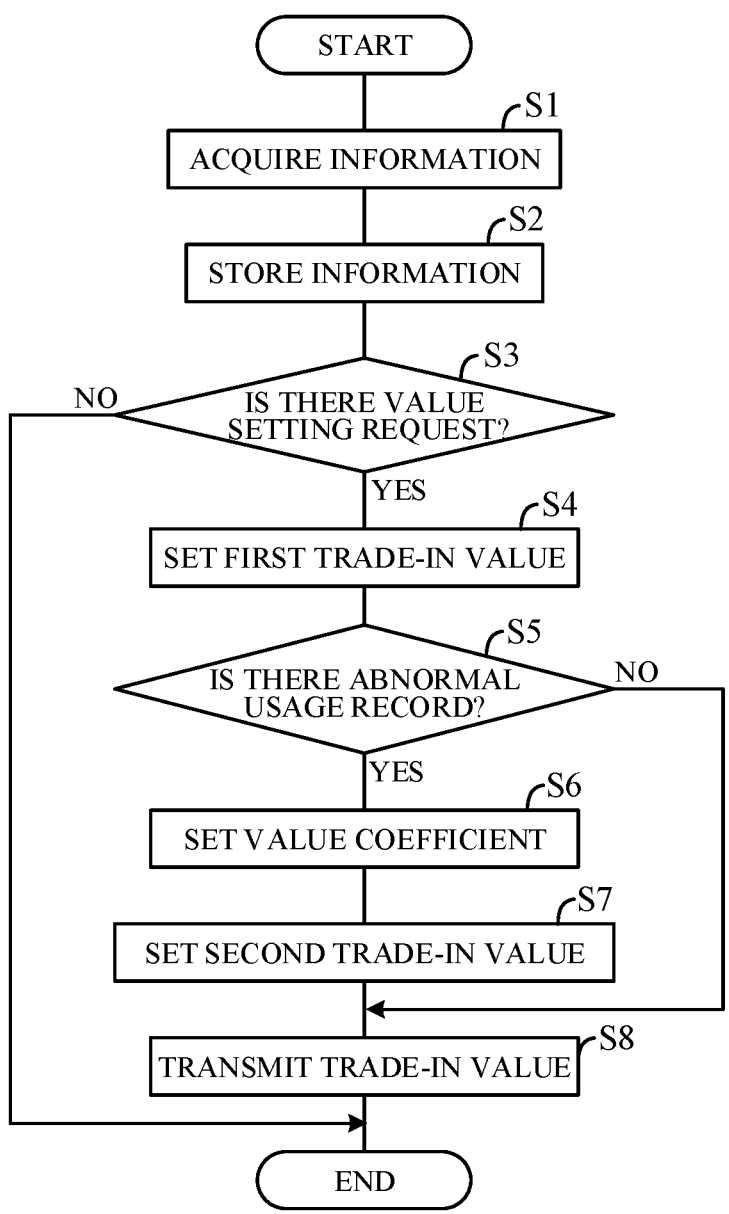
FIG. 3 is a flowchart showing an example of a processing performed by a CPU of a server device in FIG. 2.

FIG. 2 is a block diagram schematically showing the overall configuration of a battery value setting system 100 including the battery value setting apparatus according to the present embodiment. As shown in FIG. 3, the battery value setting system includes a vehicle terminal 20 mounted on a vehicle 101, a terminal (vendor terminal 30) of a disposal vendor 31 that disposes of the battery 1 mounted on the vehicle 101 and a server device 50. The server device 50 mainly constitutes the battery value setting apparatus according to the present embodiment.

As shown in FIG. 2, the vehicle terminal 20, the vendor terminal 30, and the server device 50 are connected to a network 40, such as a public wireless communication network typified by the Internet network or mobile telephone network, and are able to communicate with each other through the network 40. Examples of the network 40 also include closed communication networks provided for predetermined control areas, for example, wireless LANs, Wi-Fi (registered trademark), and the like.

The vehicle terminal 20 includes an arithmetic processing unit including a CPU (microprocessor), memory such as ROM or RAM, and other peripheral circuits. The vehicle terminal 20 includes, as functional configurations, a communication unit that makes communications through the network 40. The vehicle terminal 20 is connected to the battery ECU 15 (FIG. 1), and transmits a vehicle information transmitted from the battery ECU 15 to the server device 50 through the communication unit along with a battery ID for identifying the battery 1 and a vehicle ID for identifying the vehicle 101 at a predetermined timing.

The battery information includes information on a usage record of the battery 1. The information of the usage record includes information such as the SOC or SOH of the battery 1 calculated by the battery ECU 15, the number of times of charging or discharging, and other information such as the current flowing through the battery 1 detected by the battery ECU 15 and the voltage of the battery 1, that is, the input and output power of the battery 1, the temperature of the battery 1, and the like. Information on the failure and repair history of the battery 1, and information on the exchange of the battery 1, such as the presence or absence of replacement of the battery 1, is also included in the battery information. The battery information includes information related to a change in the specifications of the battery 1, for example, information on whether or not the operation programs stored in the battery ECU 15 have been rewritten or updated, and information indicating that components have been incorporated into the battery 1 by addition or replacement. The server device 50 calculates the trade-in value of the battery 1 based on these battery information.

The vehicle terminal 20 transmits the vehicle information in addition to the battery information to the server device 50. In the vehicle information, information on the vehicle type and the year type of the vehicle 101, and further information indicating the travel environment and travel situation of the vehicle 101 obtained by the vehicle-mounted sensor, i.e., information on a travel distance, a travel time, a stop time, an average acceleration and deceleration, a temperature environment and the like information are included. The server device 50 may calculate the trade-in price of the battery 1 using not only the battery information but also the vehicle information as a parameter.

The vendor terminal 30 includes an arithmetic processing unit including a CPU (microprocessor), memory such as ROM or RAM, and other peripheral circuits. The vehicle terminal 20 includes, as functional configurations, a communication unit that makes communications through the network 40. When the disposal vendor 31 disposes of the battery 1 mounted on the vehicle 101, the vendor terminal 30 transmits a request for setting the trade-in value (trade-in price) of the battery 1 to the server device 50 together with the battery ID of the battery 1. Then, the trade-in value (trade-in price) of the battery 1 calculated by the server device 50 is received. As a result, the disposal vendor 31 can recognize the appropriate trade-in value of the battery 1.

The server device 50 is formed, for example, as a single server or as distributed servers consisting of servers having different functions. The server device 50 may be formed as distributed virtual servers created in the cloud environment, which are called cloud servers. The server device 50 includes an arithmetic processing unit including a CPU (microprocessor), memory such as ROM or RAM, and other peripheral circuits.

The server device 50 includes, as functional configurations, a communication unit 51, an information acquisition unit 52, a determination unit 53, a value setting unit 54, an information output unit 55 and a memory unit 56. The CPU serves as the information acquisition unit 52, the determination unit 53, the value setting unit 54 and the information output unit 55.

The communication unit 51 is configured to be able to wirelessly communicate with the vehicle terminal 20 and the vendor terminal 30 through the network 40. The communication unit 51 communicates with the vehicle terminal 20 and the vendor terminal 30 in a predetermined cycle or at a predetermined timing, and receives and transmits various types of information therefrom and thereto.

The information acquisition unit 52 acquires the battery information and the vehicle information transmitted from the vehicle terminal 20 along with the corresponding battery ID and vehicle ID. Further, the information acquisition unit 52 acquires the request for setting the trade-in value of the battery 1 transmitted from the vendor terminal 30. The battery information and the vehicle information acquired by the information acquisition unit 52 are stored in the memory unit 56.

Upon receiving the request for setting the trade-in value transmitted from the vendor terminal 30, the determination unit 53 determines whether or not there is an abnormal usage record of the battery 1 based on the battery information, or the battery information and the vehicle information stored in the memory unit 56. For example, when the physical quantity of at least one of the current flowing through the battery 1, the voltage and the temperature of the battery 1 exceeds the limit value stored in advance, the determination unit 53 determines that there is an abnormal usage record.

The determination unit 53 determines that there is an abnormal usage record not only when the physical quantity transmitted from the vehicle terminal 20 exceeds the limit value, but also when the specification of the battery 1 is undesirably changed. For example, when the operation programs in the battery ECU 15 are rewritten, in particular, when there is an unofficial rewrite that is not permitted by the manufacturer, the determination unit 53 determines that there is an abnormal usage record. More specifically, if there is a rewrite of the operation program to increase the output of the battery 1 than the initial specification, it is determined that there is an abnormal usage record. On the other hand, even when the operation program needs to be updated by, for example, notification of a recall from the manufacturer, and the operation program has not been updated for a long period of time equal to or longer than a predetermined period, the determination unit 53 also determines that there is an abnormal usage record. Furthermore, even when there is the information of incorporation of the non-authorized product into the battery 1 by the so-called third party, the determination unit 53 determines that there is an abnormal usage record as the specification of the battery 1 is undesirably changed.

The value setting unit 54 sets a trade-in value (trade-in price) of the battery 1. In this case, when it is determined by the determination unit 53 that there is an abnormal usage record of the battery 1, the trade-in value of the battery 1 is set lower than when it is determined that there is no abnormal usage record. More specifically, first, the normal trade-in value (referred to as the first trade-in value) in the case where there is no abnormal usage record is calculated by using the price at the time of new battery 1, the years of use of the battery 1, and a predetermined depreciation formula. Further, when the determination unit 53 determines that there is an abnormal usage record, the value setting unit 54 set the value coefficient α within a range of 0 or more and less than 1 in accordance with the content of the abnormal usage record. Then, by multiplying the first trade-in value by the value coefficient α, the value setting unit 54 calculates the trade-in value (referred to as the second trade-in value). The first trade-in value is a standard price of the battery 1, that is, a standard trade-in value.

The value coefficient α is set to a smaller value as the degree of abnormality in the usage record increases. For example, the greater the difference between the limit value and the physical quantity when the physical quantity such as a battery current, voltage or the like exceeds the limit value, or the longer the use period of the battery 1 after rewriting to the unofficial operation program, or the longer the period of not updating the required operation program, the greater the degree of abnormality in the usage record, the value coefficient α is set to a small value. When the determination unit 53 determines that there is information for incorporating a non-authorized component into the battery 1, the value coefficient α is set to, for example, 0. When the value coefficient α is 0, the trade-in value becomes 0. Therefore, reuse of the battery 1 can be prohibited.

The information output unit 55 transmits the trade-in value (the first trade-in value and the second trade-in value) of the battery 1 set by the value setting unit 54 to the vendor terminal 30 that has transmitted the trade-in value setting request. As a result, the disposal vendor 31 can recognize an appropriate trade-in value of the battery 1.

FIG. 3 is a flowchart showing an example of a processing performed by the CPU of the server device 50 in accordance with a predetermined program. The processing shown in this flowchart is mainly performed by the information acquisition unit 52, the determination unit 53, the value setting unit 54 and the information output unit 55. This processing is started when the communication with the vehicle terminal 20 is established, and repeated at a predetermined cycle.

First, in S1 (S: processing step), the server device 50 (CPU) acquires the battery information and the vehicle information transmitted from the vehicle terminal 20 along with the corresponding to the battery ID and vehicle ID. Next, in S2, the server device 50 stores the various information acquired in S1 in the memory unit 56. Next, in S3, the server device 50 determines whether or not the trade-in value setting request of the battery 1 has been transmitted from the vendor terminal 30. If the determination in S3 is YES, the processing proceeds to S4. On the other hand, if the determination in S3 is No, the processing ends.

In S4, the server device 50 sets the first trade-in value as a regular trade-in value of the battery 1 based on the battery information corresponding to the battery ID transmitted from the vendor terminal 30 among the battery information stored in the memory unit 56. The first trade-in value may be set based on not only the battery information but also the vehicle information.

Next, in S5, the server device 50 determines whether or not there is an abnormal usage record in the battery 1 for which trade-in value setting is requested, based on the battery information stored in the memory unit 56. If the determination in S5 is YES, the processing proceeds to S6, while if the determination in S5 is NO, the processing proceeds to S8 passing S6 and S7.

In S6, the server device 50 sets the value coefficient α within a range of 0 or more and less than 1 based on the content of the abnormal usage record. Next, in S7, the server device 50 sets the second trade-in value as a trade-in value of the battery 1 with the abnormal usage record by multiplying the first trade-in value calculated in S4 by the value coefficient α set in S6. Next, in S8, the server device 50 transmits the trade-in value of the battery 1 to the vendor terminal 30. That is, the server device 50 transmits the first trade-in value set in S4 or the second trade-in value set in S7 to the vendor terminal 30.

The operation of the battery value setting apparatus according to the present embodiment is summarized as follows. The information on the usage record of the battery 1 mounted on the vehicle 101 is regularly transmitted to the server device 50 through the vehicle terminal 20 and stored in the memory unit 56 (S1 and S2). When the user of the vehicle 101 asks the vendor 31 to trade in the battery 1, the disposal vendor 31 performs transmitting the trade-in setting request of the battery 1 to the server device 50 through the vendor terminal 30.

When the request for setting the trade-in value is received by the server device 50, the first trade-in value of the battery 1 is calculated based on the usage record (SOH or the like) of the battery 1 stored in the memory unit 56 (S4). Next, it is determined whether or not there is an abnormal usage record of the battery 1 based on the battery data stored in the memory unit 56, and when it is determined that there is no abnormal usage record, the first trade-in value is transmitted as it is to the vendor terminal 30 as a trade-in value (S5→S8).

On the other hand, when it is determined that there is an abnormal usage record of the battery 1, the value coefficient α is set in accordance with the usage record, and the value coefficient α is multiplied by the first trade-in value to set the second trade-in value (S6 and S7). For example, when a situation occurs in which a lithium metal of the battery 1 is deposited due to the amount of regeneration of the battery 1 exceeding a predetermined value by the vehicle 101 traveling on a steep downward slope, it is determined that there has been an abnormal use record. In this case, the second trade-in value, which is lower than the first trade-in value, is set by multiplying the price coefficient α less than 1, and the second trade-in value is sent as a trade-in value to the vendor terminal 30 (S7→S8).

As a result, the disposal vendor 31 can set an appropriate trade-in value (trade-in price) of the battery 1 according to the usage record of the battery 1. That is, when there is an abnormal usage record of the battery 1, the degree of deterioration of the battery 1 is large, the reliability of the durability and quality of the battery 1 to be reused is reduced. For this reason, the trade-in value of the battery 1 is set at a lower value than when there is no abnormal usage record. As a result, it is possible to set an appropriate price corresponding to the residual value of the battery 1.

The present embodiment can achieve advantages and effects such as the following:

(1) A battery value setting apparatus according to the present embodiment includes an information acquisition unit 52 acquiring a battery information including an information on a usage record of the battery 1 mounted on the vehicle 101; a determination unit 53 determining whether there is an abnormal usage record of the battery 1 based on the battery information acquired by the information acquisition unit 52; and a value setting unit 54 setting a trade-in value of the battery 1 when it is determined that there is the abnormal usage record by the determination unit 53 lower than the trade-in value when it is determined that there is not the abnormal usage record (FIG. 2). In this manner, by setting the trade-in value in consideration of the presence or absence of an abnormal usage record of the battery 1, it is possible to set an appropriate trade-in value of the battery 1.

(2) The battery information includes an information on physical quantities of a current flowing through the battery 1, a voltage of the battery 1 and a temperature of the battery 1, etc. The determination unit 53 determines that there is the abnormal usage record when any of these physical quantities exceed a predetermined range in the normal usage. As a result, it is possible to appropriately determine whether or not there is an abnormal usage record of the battery 1.

(3) An operation of charging and discharging of the battery 1 is controlled by, for example, the battery ECU 15. The battery information includes an information on a rewriting of an operation program stored in advance in a memory of the battery ECU 15. The determination unit 53 determines that there is the abnormal usage record when an unofficial rewriting of the operation program is included in the battery information. That is, if there is an unofficial rewriting of the operation program, there is a possibility such as deterioration and durability of the battery 1 without the use of the battery 1 intended by the manufacturer. Considering this point, it is determined that there is the abnormal usage record of the battery 1 when the operation program is rewritten irregularly. As a result, it is possible to appropriately set the trade-in value of the battery 1.

(4) The battery information further includes an information on an update of the operation program in the battery ECU 15. The determination unit 53 determines that there is the abnormal usage record when a predetermined information, i.e., information indicating that the operation program is normally updated, is not included in the battery information. That is, for example, despite the notification of the recall of the operation program of the battery 1, if left without updating the operation program, the battery 1 is likely to deteriorate. Considering this point, it is determined that there is the abnormal usage record of the battery 1 when there is no regular update of the operation program. As a result, it is possible to appropriately set the trade-in value of the battery 1.

(5) The battery information includes an information on a component incorporated into the battery 1 by an addition or a replacement. The determination unit 53 determines that there is the abnormal usage record when a predetermined information, i.e., information indicating that a non-authorized component is incorporated into the battery 1, is included in the battery information. Thus, it is possible to set an appropriate trade-in value for the battery 1 considering that the performance of the battery 1 at the time of secondary use deteriorates due to the attachment of components other than those guaranteed by the manufacturer.

Various modifications of the above embodiment are possible. Some examples are explained in the following. In the above embodiment, the trade-in value of the battery 1 is set by the server device 50 connected so as to be able to communicate with the vehicle terminal 20. However, the trade-in value of the battery 1 may be set by the vehicle terminal 20 or the vendor terminal 30. In other words, instead of the server device 50, the vehicle terminal 20 or the vendor terminal 30 may include the battery value setting apparatus.

Figure 4:
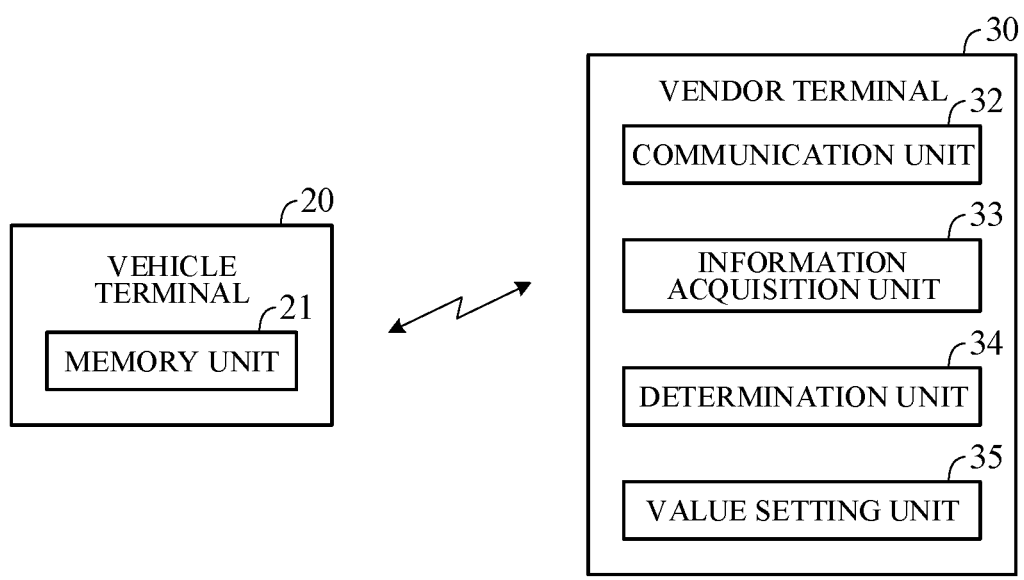
FIG. 4 is a block diagram showing a modification of FIG. 2.

As an example, FIG. 4 is a block diagram showing a configuration for setting the trade-in value by the vendor terminal 30. In FIG. 4, the battery information including a normal or abnormal usage record of the battery 1 is stored in the memory unit 21. The vendor terminal 30 includes a communication unit 32, an information acquisition unit 33, a determination unit 34 and a value setting unit 35, The communication unit 32 is configured to be able to wirelessly communicate with the vehicle terminal 20. The information acquisition unit 33 acquires the battery information stored in the memory unit 21 through the communication unit 32. The determination unit 34 determines whether or not there is an abnormal usage record of the battery 1 based on the battery information acquired by the information acquisition unit 33. When it is determined by the determination unit 34 that there is an abnormal usage record of the battery 1, the value setting unit 35 sets the trade-in value of the battery 1 lower than when it is determined that there is no abnormal usage record. The configurations of the determination unit 34 and the value setting unit 35 are the same as those of the determination unit 53 and the value setting unit 54 in FIG. 2. With such a configuration, the disposal vendor 31 can set an appropriate trade-in value of the battery 1 without using the server device 50.

In the above embodiment, presence or absence of an abnormal usage record of the battery 1 is determined based on the information of at least any physical quantity such as current flowing through the battery 1, voltage of the battery 1 and temperature of the battery 1, the information of rewriting of the operation program stored in advance in the memory of the battery ECU 15 as a control unit that controls an operation of charging and discharging of the battery 1, the information of normal updating of the operation program of the control unit, and the information of a non-authorized component incorporated in the battery 1 by addition or replacement. However, as long as it is determined whether or not there is an abnormal usage record of the battery 1 based on a battery information including an information of a usage record of the battery 1 mounted on the vehicle 101, the configuration of a determination unit may be any configuration. In the above embodiment, the information acquisition unit 33 is configured to acquire the information of the battery 1 mounted on the vehicle 101. However, so as to acquire a battery information on a battery mounted on a predetermined object other than the vehicle, an information acquisition unit it may be configured. Therefore, the battery value setting apparatus of the present invention can be applied to a battery mounted on an object other than a vehicle.

A value setting unit may have any configuration, as long as the trade-in price of the battery 1 is set lower when the determination unit 53 determines that there is an abnormal usage record of the battery 1 than when it determines that there is no abnormal usage record. In the above embodiment, the lithium-ion battery is used as a battery 1 of a secondary battery. However, the configuration of a battery is not limited to this. The battery may be configured by multiple battery packs.

The present invention can be configured as a battery value setting method including: acquiring a battery information including an information on a usage record of a battery 1 mounted on a predetermined object such as the vehicle 101; determining whether there is an abnormal usage record of the battery 1 based on the acquired battery information; and setting a trade-in value of the battery 1 when it is determined that there is the abnormal usage record lower than the trade-in value when it is determined that there is not the abnormal usage record.

The above embodiment can be combined as desired with one or more of the above modifications. The modifications can also be combined with one another.

According to the present invention, it is possible to easily set a trade-in value of a battery.

Above, while the present invention has been described with reference to the preferred embodiments thereof, it will be understood, by those skilled in the art, that various changes and modifications may be made thereto without departing from the scope of the appended claims.

What is claimed is:

1. A battery value setting apparatus, comprising
an electronic control unit including a microprocessor and a memory connected to the microprocessor, wherein the microprocessor is configured to perform:
acquiring a battery information including an information on a usage record of a battery mounted on a predetermined object;
determining whether there is an abnormal usage record of the battery based on the battery information; and
setting a trade-in value of the battery when it is determined that there is the abnormal usage record lower than the trade-in value when it is determined that there is not the abnormal usage record.

2. The battery value setting apparatus according to claim 1, wherein
the battery information includes an information on a physical quantity of any of a current flowing through the battery, a voltage of the battery and a temperature of the battery, and
the microprocessor is configured to perform
the determining including determining that there is the abnormal usage record when the physical quantity exceeds a predetermined range.

3. The battery value setting apparatus according to claim 2, wherein
the battery information includes an information on a rewriting of an operation program stored in advance in a control unit provided at the predetermined object to control an operation of charging and discharging of the battery in accordance with the operation program, and
the microprocessor is configured to perform
the determining including determining that there is the abnormal usage record when an unofficial rewriting of the operation program is included in the battery information.

4. The battery value setting apparatus according to claim 3, wherein
the battery information further includes an information on an update of the operation program, and
the microprocessor is configured to perform
the determining including determining that there is the abnormal usage record when it is not included in the battery information that the operation program is normally updated.

5. The battery value setting apparatus according to claim 4, wherein
the battery information further includes an information on a component incorporated into the battery by an addition or a replacement,
the microprocessor is configured to perform
the determining including determining that there is the abnormal usage record when it is included in the battery information that a non-authorized component is incorporated into the battery.

6. The battery value setting apparatus according to claim 5, wherein
the microprocessor is configured to perform
the setting including setting the trade-in value of the battery to zero if it is determined that there is the abnormal usage record when the non-authorized component is incorporated into the battery.

7. The battery value setting apparatus according to claim 1, wherein
the microprocessor is configured to perform
the setting including setting the trade-in value of the battery when there is not the abnormal usage record of the battery as a standard trade-in value, and if it is determined that there is the abnormal usage record, setting the trade-in value of the battery by multiplying the standard trade-in value by a coefficient greater than or equal to 0 and less than 1.

8. A battery value setting method, comprising:
acquiring a battery information including an information on a usage record of a battery mounted on a predetermined object;
determining whether there is an abnormal usage record of the battery based on the battery information; and
setting a trade-in value of the battery when it is determined that there is the abnormal usage record lower than the trade-in value when it is determined that there is not the abnormal usage record.

* * * * *